(12) United States Patent
Vater

(10) Patent No.: US 11,025,250 B2
(45) Date of Patent: Jun. 1, 2021

(54) OSCILLATION SENSOR WITH CALIBRATION UNIT AND MEASUREMENT DEVICE

(71) Applicant: Pepperl+Fuchs GmbH, Mannheim (DE)

(72) Inventor: Jochen Vater, Lampertheim (DE)

(73) Assignee: Pepperl+Fuchs GmbH

( * ) Notice: Subject to any disclaimer, the term of this patent is extended or adjusted under 35 U.S.C. 154(b) by 0 days.

(21) Appl. No.: 16/661,238

(22) Filed: Oct. 23, 2019

(65) Prior Publication Data

US 2020/0136616 A1 Apr. 30, 2020

(30) Foreign Application Priority Data

Oct. 25, 2018 (DE) .................. 10 2018 126 645.6

(51) Int. Cl.
| | |
|---|---|
| *G01N 27/00* | (2006.01) |
| *G08B 19/00* | (2006.01) |
| *G08B 21/00* | (2006.01) |
| *G08B 23/00* | (2006.01) |
| *H03K 17/95* | (2006.01) |
| *H03B 5/04* | (2006.01) |

(52) U.S. Cl.
CPC .......... *H03K 17/9545* (2013.01); *H03B 5/04* (2013.01); *H03K 17/9547* (2013.01); *H03K 2217/94031* (2013.01)

(58) Field of Classification Search
CPC .......... H03K 17/9545; H03K 17/9547; H03K 2217/94031; H03B 5/04; G01V 3/10; G01V 3/102; G01V 3/101; G01R 27/267; G01R 27/2688

USPC .......................................................... 331/65
See application file for complete search history.

(56) References Cited

U.S. PATENT DOCUMENTS

| | | | | |
|---|---|---|---|---|
| 2005/0231360 A1* | 10/2005 | Fujimori | ............ | H03K 17/9547 340/539.23 |
| 2010/0225332 A1 | 9/2010 | Niwa | | |
| 2018/0123587 A1 | 5/2018 | Kühn | | |
| 2020/0136615 A1* | 4/2020 | Kuhn | ....................... | H03B 5/04 |

FOREIGN PATENT DOCUMENTS

WO 2016141965 A1 9/2016

* cited by examiner

*Primary Examiner* — Richard Tan
(74) *Attorney, Agent, or Firm* — BI; Robert Plotkin

(57) ABSTRACT

The invention relates to an oscillating sensor for a measurement device comprising:
an oscillator comprising:
  a resonance circuit for providing an oscillation signal;
  a gain stage configured to provide a feed-back to the resonance circuit to inject energy for excitation of the oscillator to maintain oscillation;
  at least one calibration element to adjust the open loop gain of the oscillator;
a calibration unit to provide a modulated calibration control signal to selectively adjust an electrical measure of the at least one calibration element based on at least one predetermined duty cycle,
wherein the calibration unit is further configured to provide the modulated calibration control signal with at least one cycle frequency which depends on the oscillation frequency.

14 Claims, 4 Drawing Sheets

OSCILLATION SENSOR WITH CALIBRATION UNIT AND MEASUREMENT DEVICE

TECHNICAL FIELD

The present invention relates to measurement devices with oscillation sensors. Particularly, the present invention relates to calibrating oscillation sensors using a modulated calibration element.

TECHNICAL BACKGROUND

Oscillation sensors are often used to detect a change of impedance or attenuation caused by various physical effects. Oscillation sensors usually have an oscillator including a resonance circuit formed with a sensing coil and/or with a sensing capacitor.

Particularly, oscillation sensors are commonly applied e.g. for proximity sensors where the presence, non-presence of a conductive object in or movement of a conductive object within a sensing range of a sensing coil shall be detected. During operation, such an oscillator oscillates while the sensing coil produces an alternating magnetic field which is substantially affected by the presence of conductive objects. Therefore, conductive objects which enter or leave a sensing range of the sensing coil or move in or out of the sensing range produce a change of impedance of the sensing coil.

During operation the resonance circuit has a resonance frequency which is determined by the inductance of the sensing coil and by the capacitance of the capacity. By means of a feedback amplification, the resonance circuit is excited so that the oscillation is maintained by injecting energy in phase with the oscillation. Further, the presence of an object in the sensing range leads to a decrease of a quality factor of the resonance circuit caused by an energy loss due to the production of eddy currents in the object. In operation this results in a change of oscillation frequency of the excited oscillation and in a change of the amplitude of oscillation.

For instance, in applications where the presence, non-presence or movement of objects shall be detected often the amplitude variation is analyzed. Therefore, the characteristics of the feedback amplification is usually configured to obtain a high sensitivity regarding an amplitude change with respect to a change of resonance characteristics due to the presence of an object in the sensing range.

Calibration of the sensitivity of such an oscillation sensor and setting of the operating point is usually made by means of a variable calibration element which may be a passive electrical component in the feedback loop used for excitation of the oscillation. The calibration element may be a resistor or the like. As laser calibration of such a calibration element is expensive and does not allow recalibration, electronic calibration is preferred.

For example, document WO2016/141965 A1 relates to an oscillator with resonance circuit and a feedback gain stage. In a feedback loop an adjustment resistor is provided which is configured to be coupled into the feedback loop by means of a switch. An effective resistance of the adjustment resistor can be set for calibration by controlling the switch by means of a duty cycle of a pulse width modulated control signal.

The calibration of the oscillation sensor is initially made by tuning an electrical quantity of the calibration element. If the calibration element is a switchable adjustment resistor which is controlled by a pulse width modulated signal, the duty cycle determines an effective resistance for the feedback coupling.

However, control via a pulse width modulation has the potential to inject low frequency harmonics into the circuitry which are essentially determined by the cycle frequency of the pulse width modulation and the specific duty cycle. These harmonics cannot be easily separated from the sensor signal and affect the operation of the oscillation sensor so that the signal-to-noise ratio is essentially degraded. As it depends on the calibration what duty cycle is selected different harmonics are introduced into each oscillation sensor so that they are difficult to eliminate by filtering.

It is therefore an object of the present invention to provide a tunable oscillation sensor and a measurement device which can be calibrated by a variable calibration element and wherein a negative effect of a modulation injected by a pulse width modulation signal can be reduced to achieve a high signal-to-noise ratio.

SUMMARY OF THE INVENTION

Above object has been achieved by the oscillation sensor according to claim 1 and the measurement device and the method for operating the oscillation sensor according to the further independent claims.

Further embodiments are indicated in the depending subclaims.

According to a first aspect an oscillating sensor for a measurement device is provided comprising:
  an oscillator comprising:
    a resonance circuit for providing an oscillation signal;
    a gain stage configured to provide a feedback to the resonance circuit to inject energy for excitation of the resonance circuit to maintain oscillation;
    at least one calibration element to adjust the open loop gain of the oscillator;
  a calibration unit to provide a modulated calibration control signal to selectively adjust an electrical measure of the at least one calibration element based on at least one predetermined duty cycle,
  wherein the calibration unit is further configured to provide the modulated calibration control signal with a cycle frequency which depends on the oscillation frequency.

In the above oscillation sensor, an electronic calibration is provided by coupling and decoupling a calibration element controlled by a calibration control signal to provide an effective electrical measure of the calibration element. Setting the effective electrical measure allows to calibrate the oscillation sensor with respect to a desired sensitivity and operating point. The calibration control signal is provided as a pulse width modulation signal wherein the electrical measure is determined by a duty cycle. Therefore, calibration can be made by selecting the duty cycle appropriately.

In the above oscillation sensor, the calibration element controls the amount of energy used for exciting oscillation of the resonance circuit so that in a steady (swung-in) state the amount of injected energy corresponds to the amount of energy loss due to energy loss of the magnetic field. As the calibration element is controlled by the pulse width modulation signal its cycle frequency has an effect on the oscillation of the resonance circuit. In the common case where the oscillation frequency does not correspond to an integer multiple of the cycle frequency it results in a modulation effect on the amplitude of the oscillation. Where the sensor signal amplitude is used as the measurement signal of the oscillation sensor this would result in a substantial decrease of the signal-to-noise ratio.

One idea of the present invention is to provide the calibration control signal as a pulse width modulation signal with a cycle frequency which depends on the oscillation frequency of the resonance circuit. Compared with standard pulse width modulation schemes, where the cycle frequency is kept constant, the above method allows to reduce the modulation effect by carefully adapting the cycle frequency to the oscillation frequency so that no modulation of the sensor signal occurs.

Particularly, when the oscillation frequency only slightly differs from the integer multiples of the cycle frequency a low frequency harmonic overlaying the sensor signal (derived from the amplitude of the oscillation signal) is generated. By adapting the cycle frequency depending on the oscillation frequency, the cycle frequency can be selected so that no specific frequency is introduced into the amplitude characteristics of the oscillation signal of the oscillation sensor which substantially improves the signal-to-noise ratio of the amplitude signal derived therefrom. The above method allows significant increase of the signal-to-noise ratio over a broad range of oscillation frequencies. As the cycle frequency is automatically adapted to the oscillation frequency, parasitic effects, such as temperature variations, aging or the like can be easily compensated. Furthermore, for each oscillation frequency, an appropriate cycle frequency from multiple ranges of the cycle frequencies can be selected so that a higher degree of freedom for selecting the operating point is possible.

Furthermore, the modulated calibration control signal may correspond to a pulse width modulation signal.

Furthermore, the calibration element may be configured to be controlled by a modulated calibration feedback control signal wherein particularly the calibration element includes a passive electrical component, particularly a resistor, and a switch controlled by a modulated calibration feedback control signal.

Additionally or alternatively, the calibration element may include a gain control element to be controlled by a modulated calibration gain control signal for adjusting the gain of the gain stage wherein particularly the calibration element includes a resistor and a switch controlled by a modulated calibration gain control signal.

According to an embodiment the calibration unit is configured to set the cycle frequency $f_{PWM}$ to a value where the amplitude modulation of the oscillation signal is lower than 1%, preferably lower than 0.1% of the total oscillation amplitude.

According to an embodiment, the calibration unit is configured to set the cycle frequency $f_{PWM}$ to a value which is selected from one of frequency ranges which are determined by cycle times which are not included in ranges of +/−2% of the oscillation cycle times $T_{osc}$, preferably +/−5% of the oscillation cycle times $T_{osc}$, around the PWM cycle times $T_{PWM}$ as defined by $T_{PWM}=n*T_{osc}$ and $T_{PWM}=(n+\frac{1}{2})*T_{osc}$ wherein the oscillation cycle time $T_{osc}$ corresponds to the oscillating frequency.

Essentially, the cycle time $T_{PWM}$ should be selected in a range where the cycle time $T_{PWM}$ is distanced from the product of the oscillation cycle time $T_{osc}$ and (n+½) by more than 2% and not more than 25%, preferably by more than 5% not more than 15% of the oscillation cycle time $T_{osc}$.

Moreover, a frequency counter is provided to measure the oscillation frequency of the resonance circuit and to provide an indication of the oscillation frequency $f_{osc}$ to the calibration unit.

According to an embodiment, the resonance circuit may have a sensing coil and/or a sensing capacitor.

According to another aspect, a measurement device is provided comprising an oscillating sensor and an analyzing circuit which is configured to receive an indication of the oscillation signal and to provide an amplitude signal as a sensor signal indicating the amplitude of the oscillation signal.

Furthermore, the resonance circuit may have a sensing coil for detecting a conductive object being in a sensing range of the sensing coil.

According to a further aspect, a method for operating an oscillation sensor is provided comprising a resonance circuit for providing an oscillation signal, a gain stage configured to feedback to the resonance circuit to inject energy for excitation of the resonance circuit to maintain oscillation, and a calibration element to adjust the feedback coupling between the gain stage and the resonance circuit, wherein an electrical measure of the calibration element is adjusted based on at least one predetermined duty cycle of a modulated calibration control signal wherein the modulated calibration control signal has a cycle frequency which depends on the oscillation frequency.

BRIEF DESCRIPTION OF THE DRAWINGS

Embodiments are described in more detail in conjunction with the accompanying drawings in which.

DESCRIPTION OF EMBODIMENTS

Figure 1:
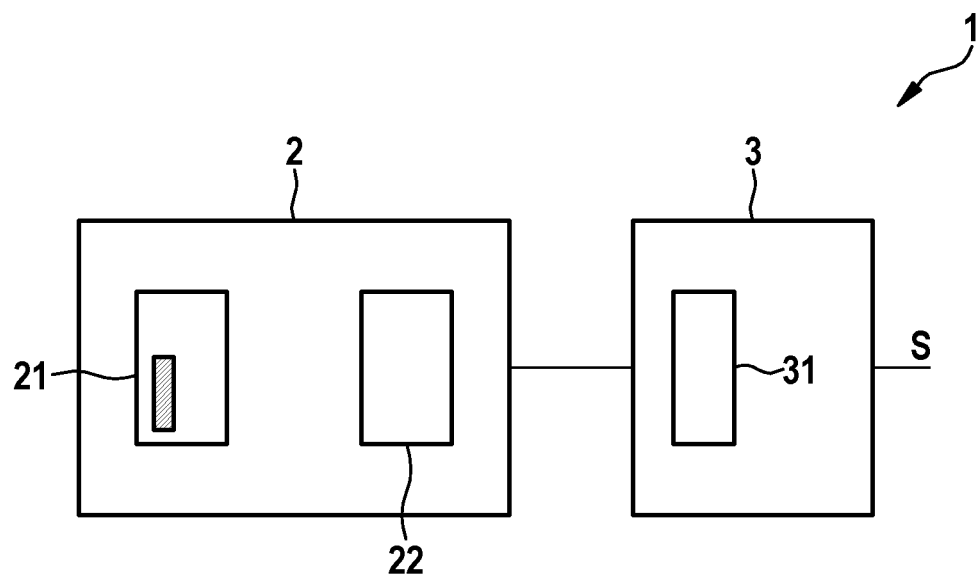
FIG. 1 shows a schematic view of a proximity sensor including an inductive sensor.

FIG. 1 schematically shows a measurement device with an oscillating sensor 2 and an analyzing circuit 3 to analyze an amplitude of an oscillation signal of an oscillation of the oscillation sensor 2 and to generate a sensor signal S. The oscillating sensor 2 has a resonance circuit 21 and an amplifier 22.

The analyzing unit 3 substantially includes an amplitude determination circuit 31 which provides an amplitude signal as a sensor signal representing the amplitude of the oscillation.

The resonance circuit 21 has an inductivity which may be provided as a sensing coil. In operation, the resonance circuit 21 oscillates and generates an alternating magnetic field in a sensing range around the sensing coil. The alternating magnetic field is affected by any conductive objects being present or moving through the sensing range. This is caused by eddy currents which are induced in the conductive objects in the sensing range so that energy is withdrawn from the resonance circuit 21. This energy loss effects in a change of inductance of the sensing coil and in an attenuation of the oscillation. Due to the changed attenuation of the resonance circuit, the amplitude of oscillation may vary depending on the presence or non-presence of a conductive object in the sensing range.

Figure 2:
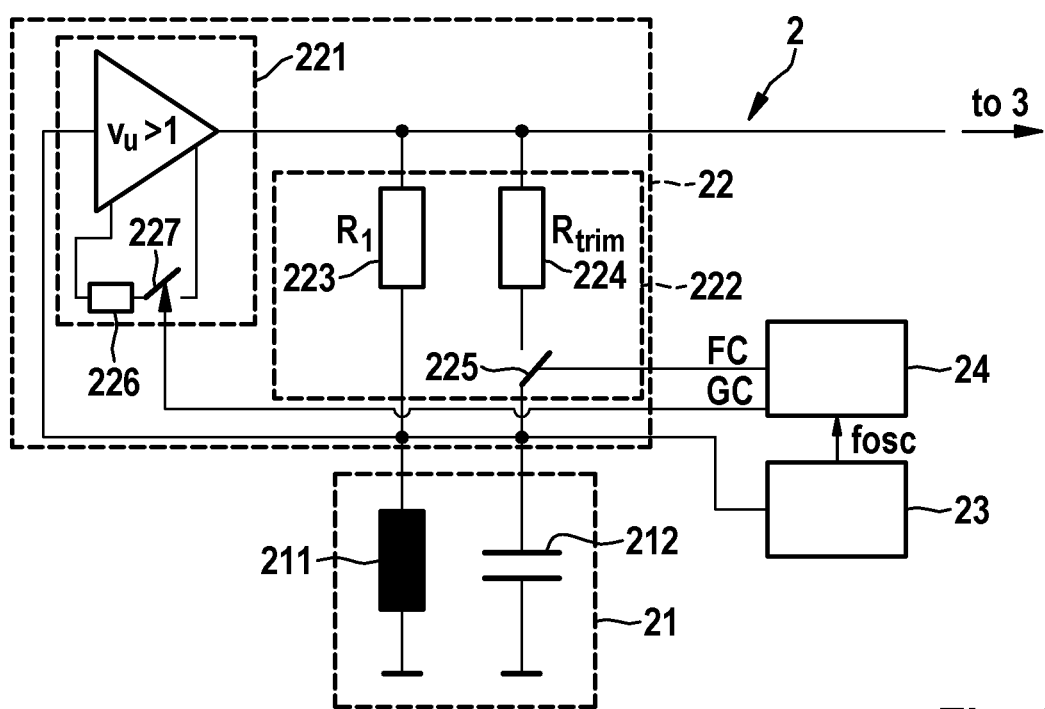
FIG. 2 shows a more detailed schematic view of an inductive sensor with a calibration unit.

In FIG. 2, the inductive sensor 2 is shown in more detail. An oscillator is formed with a resonance circuit 21 with the sensing coil 211 and a capacitor 212 while the amplifier 22 has a gain stage 221 with a gain of larger than 1 and a feedback circuit 222. In the shown embodiment, the feedback circuit 222 comprises a first resistor 223 with a resistance of R1 and a second resistor 224 with a resistance of Run which is in series with a first calibration switch 225. The first calibration switch 225 may be implemented as any kind of electronic switch such as a MOSFET transistor or bipolar transistor.

The second resistor 224 and the first calibration switch 225 act together as a calibration resistor (calibration element) which may be controlled by a modulated calibration feedback control signal FC to adjust the feedback coupling between the gain stage 221 and the resonance circuit 21.

The gain of the gain stage 221 can be adjusted by means of a further calibration element which may include a gain control element to be controlled by a modulated calibration gain control signal GC for adjusting the gain of the gain stage 221. The gain control element can be generally of any kind so that the gain of the gain stage 221 is controlled by the duty cycle of the modulated calibration gain control signal GC. In the given example, the gain control element may include a calibration element 226,227 which may comprise a third resistor 226 with a resistance of $R_{gain}$ and a second calibration switch 227. The second calibration switch 227 is controlled by the modulated calibration gain control signal GC. The second calibration switch 227 may be implemented as any kind of electronic switch such as a MOSFET transistor or bipolar transistor. In other embodiments, the gain stage 221 can be configured to be controlled by the modulated calibration gain control signal GC without switching of a resistor.

In general, the calibration element of the feedback circuit 222 and/or of the calibration element of the gain stage 221 can be formed as a resistor network comprising a switch, so that the resistance of the resistor network can be switched between two different resistance values (including a very high/infinite resistance value) by the respective control signal FC, GC. Therefore, the arrangement of the switch with respect to the resistors can be any combination of parallel and serial connection.

A calibration unit 24 is provided for providing the modulated calibration feedback control signal FC to a control terminal of the first calibration switch 225 to control the first calibration switch 225 to open or to close and/or for providing the modulated calibration gain control signal GC to a control terminal of the second calibration switch 227 to control the second calibration switch 227 to open or to close.

By controlling the first calibration switch 225, the effective resistance of the feedback circuit 222, particularly the effective resistance of the series of the calibration switch and the second resistor 224 can be controlled. To vary the effective resistance of the second resistor 224, the first calibration switch 225 is controlled by a pulse width modulation signal having a cycle frequency and at least one duty cycle. Analogously, by controlling the second calibration switch 227, the gain of the gain stage 221 can be controlled. To vary the effective resistance of the third resistor 226, the second calibration switch 227 is controlled by a pulse width modulation (PWM) signal having a cycle frequency $f_{PWM}$ and a duty cycle DC.

The cycle frequency is determined by a cycle time which is defined as a total period including a first time in which the calibration switch is closed and a second time in which the calibration switch is open. The duty cycle indicates a ratio of the first time in which the calibration switch is closed by the cycle time. The control with a pulse width modulated control signal results in an effective resistance of the second resistor 224 determined as a quotient of the resistance of the second resistor 224 and the duty cycle.

The calibration is made by determining one or more appropriate duty cycles to set the effective resistance of the second resistor 224. In case of more than one duty cycle a sequence of duty cycles can be selected to obtain the desired calibration. The calibration is usually made initially and will be maintained until a recalibration will be carried out. Moreover, adjustments in calibration may be made continuously or regularly for compensating on short-termed influences such as temperature or the like.

Figure 3B:
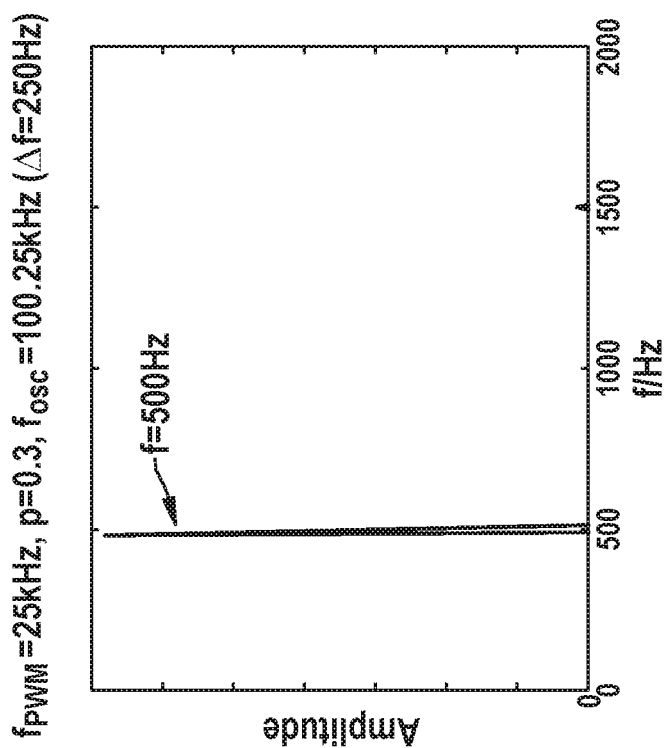
FIGS. 3a and 3b show examples for the impact of modulation when a single modulation cycle frequency is used.
Figure 3A:
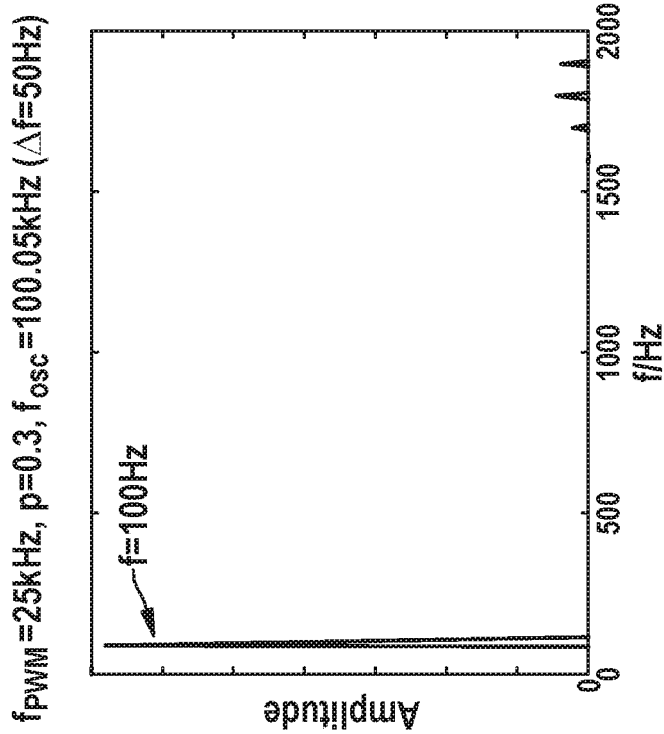

FIGS. 3a and 3b show exemplary Fourier diagrams of a characteristics of the amplitude of modulation of the energy injection into the resonance circuit 21 versus frequency of modulation of energy injection for an exemplary measurement device. As it is illustrated the cycle frequency $f_{PWM}$ of the pulse width modulation is 25 kHz, the duty cycle 0.3 and the oscillation frequency $f_{osc}$ are 100.05 and 100.25 kHz, respectively, a low frequency range of the amplitude modulations onto the oscillation signal is shown. As it is illustrated in FIGS. 3a and 3b for two examples where the cycle frequency $f_{PWM}$ of the pulse width modulation is 25 kHz, the duty cycle 0.3 and the oscillation frequency $f_{osc}$ is 100.05 and 100.25 kHz, respectively, a lower range of the frequency spectrum of the oscillation signal is shown. It can be seen that due to the PWM controlled feedback circuit 222 there will be produced a modulation frequency of 100 Hz and 500 Hz, respectively, of amplitude modulation onto the oscillation signal of the resonance circuit 21 depending on the selection of the cycle frequency $f_{PWM}$ and depending on the frequency of the oscillation signal. The signal portion of the low frequency amplitude modulations onto the oscillation signal cannot be filtered out as it belongs to the frequency range where the oscillation signal is analyzed to obtain the sensor signal.

Figure 4B:
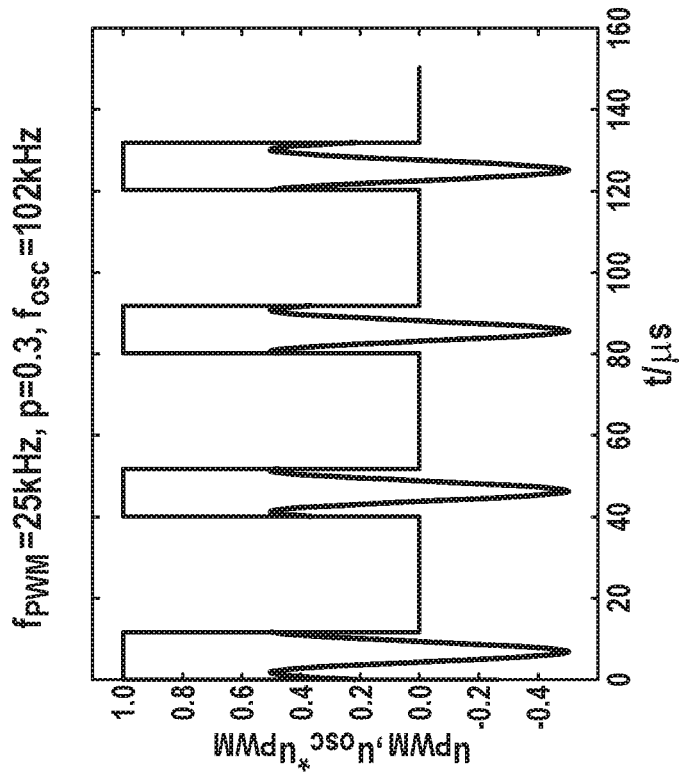
FIGS. 4a and 4b show a signal diagram including the oscillator signal and the calibration control signal in case of harmonic and disharmonic excitation.
Figure 4A:
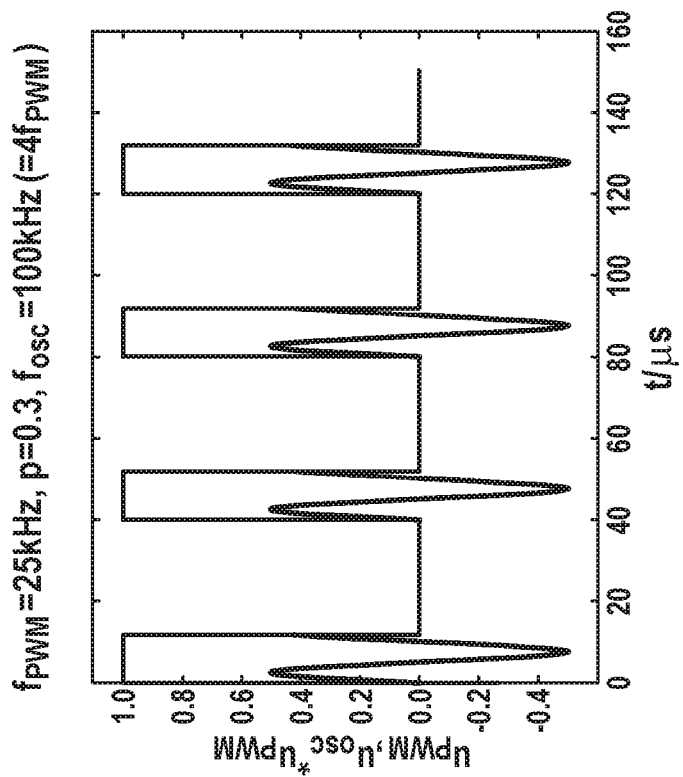

The development of low frequency amplitude modulations onto the oscillation signal generated by the pulse width modulated energy injection can be explained in view of the diagrams of FIGS. 4a and 4b. FIGS. 4a and 4b show the characteristics of the duty cycle signal ($U_{PWM}$) and the product of the duty cycle and the oscillation frequency signal ($U_{osc}*U_{PWM}$). As shown in FIG. 4a where the oscillation frequency is an integer multiple of the cycle frequency it can be seen from the same characteristics of the modulation in the duty cycle window that no modulation of the amplitude of the modulation of the energy injection into the resonance circuit 21 is caused since the energy injection into the resonance circuit 21 has the same phase and therefore has the same amount for all cycles.

However, as illustrated in FIG. 4b, since the oscillation frequency usually cannot be exactly set to be an integer multiple of the cycle frequency $f_{PWM}$ of the pulse width modulation, a modulation of the energy injection into the resonance circuit 21 will be incurred so that an amplitude modulation with a modulation frequency $f_{mod}=2(f_{osc}-n \times f_{PWM})$ will be generated. The modulation can be seen from the differing characteristics of the oscillation signal modulation in the duty cycle window. While the modulation is not directly shown in the Figures it can be seen that the injection of energy is not equal for every phase angle of the sinusoidal oscillation which may result in slowly varying phase shift between the pulse width modulation and the oscillation forming a low frequency modulation of the oscillation amplitude.

To avoid the generation of an amplitude modulation of the energy injection into the resonance circuit 21 the cycle frequency $f_{PWM}$ of the pulse width modulation is varied depending on the oscillation frequency.

As it is predictable which cycle frequencies will result in the amplitude modulations of the oscillation, an optimal cycle frequency can be derived from the oscillation frequency to avoid or minimize these modulations. By making the cycle frequency depending on the oscillation frequency, the cycle frequency may immediately follow a variation of the oscillation frequency. To avoid the generation of an amplitude modulation of the oscillation signal caused by setting the calibration element by means of a modulated calibration signal, the cycle frequency of the pulse width modulation is varied depending on the oscillation frequency so as to avoid the corresponding amplitude modulation.

Therefore, a frequency counter 23 may be provided which measures the oscillation frequency of the resonance circuit 21 and provides an indication of the oscillation frequency $f_{osc}$ to the calibration unit 24. Alternatively, the oscillation frequency can be measured at other nodes of the circuitry, such as at the output of the amplifier 22 or of the gain stage 221.

In case of a fixed cycle frequency $f_{PWM}$, tolerances of the resonance circuit 21 or frequency shifts by the presence or non-presence of detectable objects in the sensing range may result in an oscillation frequency corresponding to a harmonic (integer multiple) or (n+½)–multiple of the cycle frequency, such as:

$$f_{osc} = n \cdot f_{PWM}$$

$$f_{osc} = (n+\tfrac{1}{2}) \cdot f_{PWM}$$

In these cases and in a frequency range around the harmonics, strong amplitude modulations occur in a low-frequency range or may lead to a significant distortion of the sensing signal.

These distortions are furthermore depending on the at least one duty cycle of the pulse width modulation.

Figure 5:
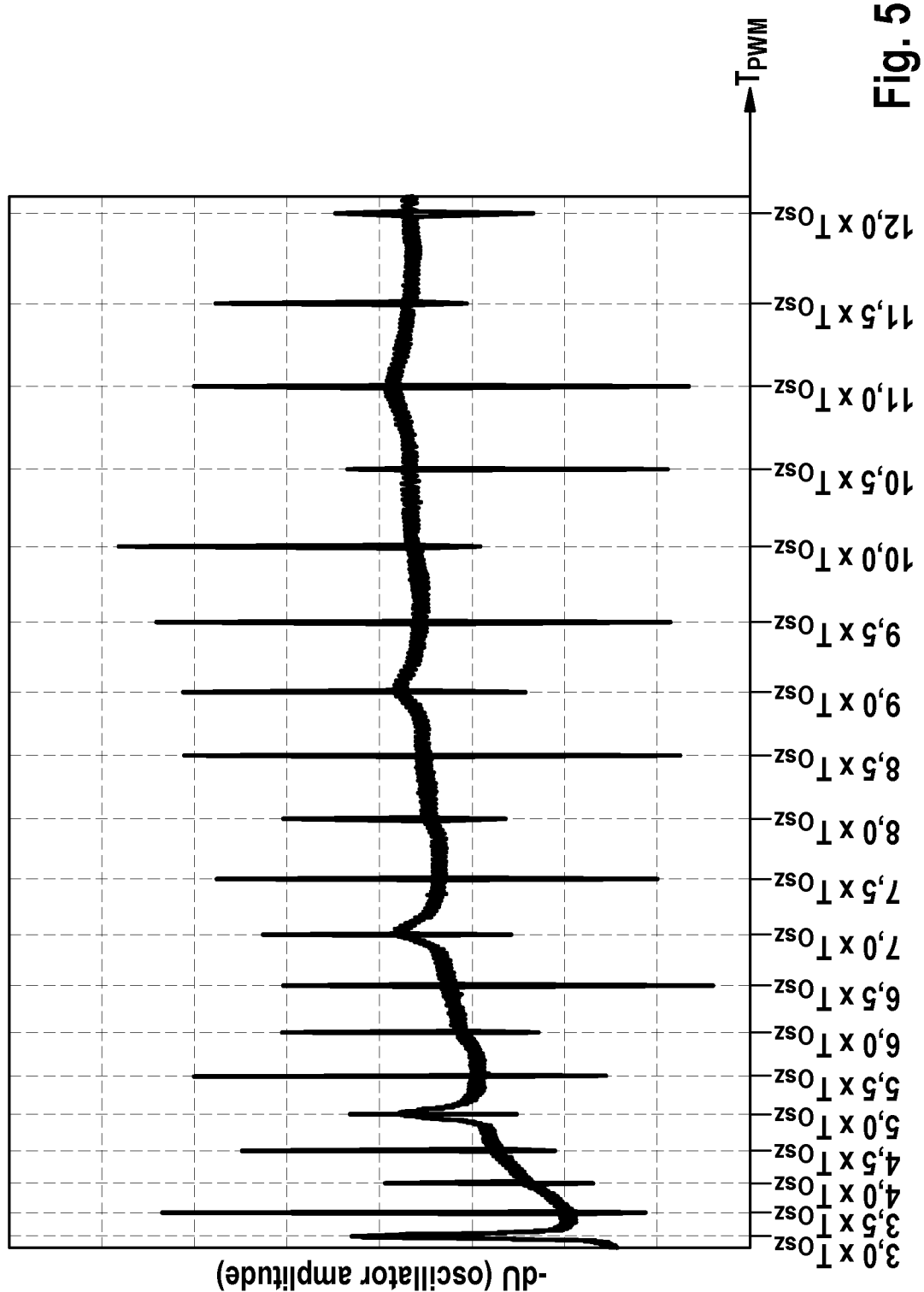
FIG. 5 shows a diagram for amplitude modulation of oscillation amplitude for different cycle frequencies, or cycle periods.

FIG. 5 shows a diagram of a normalized and linearized (with respect to the distance of an object) attenuation. A positive attenuation results in a decrease of the amplitude so that the y-axis is denominated with −dU. As shown in the diagram of FIG. 5 for different cycle frequencies, or cycle periods $T_{PWM} = 1/f_{PWM}$, the effect on the oscillation amplitude is shown. It can be seen that for integer multiple harmonics or for (n+½)-harmonics, a substantial change of amplitude (change of attenuation) occurs. It is therefore preferred to select a cycle time $T_{PWM}$ in a range where the cycle time $T_{PWM}$ is distanced from the oscillation cycle times $T_{osc} \cdot (n+\tfrac{1}{2})$ by more than 2% and not more than 25% preferably by more than 5% and not more than 15% of the oscillation cycle time $T_{osc}$:

$$0.05 \cdot T_{osc} < |T_{PWM} - T_{osc} \cdot (n+\tfrac{1}{2})| < 0.15 \cdot T_{osc}$$

Once the cycle time is set, it may be permanently adapted to a changing oscillation frequency as long as it does not come close to a cycle time-oscillation time combination at which a low frequency modulation occurs.

The invention claimed is:

1. Oscillating sensor for a measurement device comprising:
   an oscillator comprising:
     a resonance circuit for providing an oscillation signal;
     a gain stage configured to provide a feed-back to the resonance circuit to inject energy for excitation of the oscillator to maintain oscillation;
     at least one calibration element to adjust an open loop gain of the oscillator;
   a calibration unit to provide a modulated calibration control signal to selectively adjust an electrical measure of the at least one calibration element based on at least one predetermined duty cycle,
   characterized in that
   a frequency counter is provided to measure an oscillation frequency of the oscillation signal and to provide an indication of the oscillation frequency to the calibration unit, and that
   the calibration unit is further configured to provide the modulated calibration control signal with at least one cycle frequency which depends on the oscillation frequency of the oscillation signal.

2. The oscillating sensor according to claim 1, wherein the modulated calibration control signal corresponds to a pulse width modulation signal.

3. The oscillating sensor according to claim 1, wherein the at least one calibration element is configured to be controlled by a modulated calibration feedback control signal wherein particularly the at least one calibration element includes a passive electrical component, particularly a resistor, and a switch controlled by the modulated calibration feedback control signal.

4. The oscillating sensor according to claim 1, wherein the at least one calibration element includes a gain control element to be controlled by a modulated calibration gain control signal for adjusting a gain of the gain stage wherein particularly the at least one calibration element includes a resistor and a switch controlled by the modulated calibration gain control signal.

5. The oscillating sensor according to claim 1, wherein the calibration unit is configured to maintain the at least one predetermined duty cycle while varying the at least one cycle frequency.

6. The oscillating sensor according to claim 1, wherein the calibration unit is configured to set the at least one cycle frequency to a value where an amplitude modulation of the oscillation signal is lower than 1%, preferably lower than 0.1% of a total oscillation amplitude of the oscillation signal.

7. The oscillating sensor according to claim 5, wherein the calibration unit is configured to set the at least one cycle frequency to a value where an amplitude modulation of the oscillation signal is lower than 1%, preferably lower than 0.1% of a total oscillation amplitude of the oscillation signal.

8. The oscillating sensor according to claim 1, wherein the calibration unit is configured to set the at least one cycle frequency to a value which is selected from one of frequency ranges which are determined by a plurality of cycle times which are selected from a range in which cycle time is different from (n+½) multiplied by the oscillation cycle time by more than 2% and not more than 25%, preferably by more than 5% not more than 15% of the oscillation cycle time, wherein the oscillation cycle time corresponds to the oscillating frequency.

9. The oscillating sensor according to claim 6, wherein the calibration unit is configured to set the at least one cycle frequency to a value which is selected from one of frequency ranges which are determined by a plurality of cycle times which are selected from a range in which cycle time is different from (n+½) multiplied by the oscillation cycle time by more than 2% and not more than 25%, preferably by more than 5% not more than 15% of the oscillation cycle time, wherein the oscillation cycle time corresponds to the oscillating frequency.

10. The oscillating sensor according to claim 7, wherein the calibration unit is configured to set the cycle frequency to a value which is selected from one of frequency ranges which are determined by a plurality of cycle times which are selected from a range in which cycle time is different from (n+½) multiplied by the oscillation cycle time by more than 2% and not more than 25%, preferably by more than 5% not more than 15% of the oscillation cycle time, wherein the oscillation cycle time corresponds to the oscillating frequency.

11. The oscillating sensor according to claim 1, wherein the resonance circuit has a sensing coil and/or a sensing capacitor.

12. The oscillating sensor of claim 1, further comprising an analyzing circuit which is configured to receive an indication of the oscillation signal and to provide an amplitude signal as a sensor signal indicating an amplitude of the oscillation signal.

13. The oscillating sensor of claim 12, wherein the resonance circuit has a sensing coil for detecting a conductive object being in a sensing range of the sensing coil.

14. Method for operating an oscillation sensor, the oscillation sensor comprising an oscillator, the oscillator comprising a resonance circuit for providing an oscillation signal, a gain stage configured to feed back to the resonance circuit to inject energy for excitation of the resonance circuit to maintain oscillation, the oscillation sensor further comprising at least one calibration element to adjust a feedback coupling between the gain stage and the resonance circuit, wherein an electrical measure of the at least one calibration element is adjusted based on at least one predetermined duty cycle of a modulated calibration control signal characterized in that a frequency counter is provided to measure an oscillation frequency of the oscillation signal and to provide an indication of the oscillation frequency to the at least one calibration unit, and that the modulated calibration control signal has at least one cycle frequency, which depends on the oscillation frequency of the oscillation signal.

* * * * *